United States Patent
Hsu et al.

(10) Patent No.: US 7,357,174 B2
(45) Date of Patent: Apr. 15, 2008

(54) SUPPORTING SEAT FOR SUPPORTING WEIGHT OF HEAT DISSIPATING FINS TO AVOID DEFORMATION OF HEAT DISSIPATING TUBES EXTENDING THROUGH THE HEAT DISSIPATING FINS

(75) Inventors: Tsung-Jui Hsu, Changhua Hsien (TW); Ying-Lin Hsu, Kaohsiung (TW)

(73) Assignee: Cooler Master Co., Ltd., Taipei Hsien (TW)

( * ) Notice: Subject to any disclaimer, the term of this patent is extended or adjusted under 35 U.S.C. 154(b) by 122 days.

(21) Appl. No.: 11/443,321

(22) Filed: May 30, 2006

(65) Prior Publication Data
US 2006/0272799 A1    Dec. 7, 2006

(30) Foreign Application Priority Data
Jun. 3, 2005   (TW) .............................. 94209299 U

(51) Int. Cl.
*F28D 15/00* (2006.01)
*H05K 7/20* (2006.01)

(52) U.S. Cl. .......................... 165/104.33; 165/104.21; 361/700

(58) Field of Classification Search ............... 165/80.3, 165/104.21, 104.33, 104.34, 67, 79; 361/697, 361/700, 726; 257/714, 715, 718, 719
See application file for complete search history.

(56) References Cited

U.S. PATENT DOCUMENTS

| | | | |
|---|---|---|---|
| 6,625,021 B1 * | 9/2003 | Lofland et al. | 361/697 |
| 7,215,548 B1 * | 5/2007 | Wu et al. | 361/703 |
| 2003/0218849 A1 * | 11/2003 | Mochizuki et al. | 361/103 |
| 2004/0035558 A1 * | 2/2004 | Todd et al. | 165/104.26 |
| 2005/0067144 A1 * | 3/2005 | Chou | 165/80.3 |
| 2007/0095508 A1 * | 5/2007 | Xia et al. | 165/104.33 |

FOREIGN PATENT DOCUMENTS
JP          10107192 A    *   4/1998

* cited by examiner

*Primary Examiner*—Tho Duong
(74) *Attorney, Agent, or Firm*—Alan Kamrath; Kamrath & Associates PA

(57) ABSTRACT

A supporting seat includes a base adapted to be securely connected to the heat conductive plate, two arms extending obliquely from the base from two opposed sides of the base, two engagement plates each formed on a free end of a corresponding arm and adapted to engage with a bottom face of a lowermost one of the heat dissipating fins and multiple through holes defined through each of the two engagement plates for extension of the heat dissipating tubes. Weight of the heat dissipating fins is supported and deformation of the heat dissipating tubes is prevented.

5 Claims, 4 Drawing Sheets

SUPPORTING SEAT FOR SUPPORTING WEIGHT OF HEAT DISSIPATING FINS TO AVOID DEFORMATION OF HEAT DISSIPATING TUBES EXTENDING THROUGH THE HEAT DISSIPATING FINS

BACKGROUND OF THE INVENTION

1. Field of the Invention

The present invention relates to a supporting seat, and more particularly to a supporting seat for supporting weight of heat dissipating fins to avoid deformation of heat dissipating tubes which extend through the heat dissipating fins.

2. Description of the Prior Art

In order to effectively dissipate heat generated by CPU (central processing unit), a heat sink normally is provided with multiple heat dissipating fins and multiple heat dissipating tubes respectively extending through the heat dissipating fins. Each of the heat dissipating tubes is filled with a kind of working fluid to absorb heat from the CPU. After the heat from the CPU is absorbed by the working fluid in the heat dissipating tubes, a portion of the working fluid becomes vapor and flows to different areas in the heat dissipating tubes to conduct heat exchange. Once the heat exchange is conducted with air outside the heat dissipating tubes, the temperature of the working fluid is reduced and the vapor returns to liquid phase again to keep on the cycle of absorbing heat from the CPU. This kind of heat dissipating structure does dissipate heat effectively. However, after a long period of time using the heat dissipating structure, the heat dissipating tubes will be deformed due to the weight of the heat dissipating fins on top of the heat dissipating tubes. It is because most of the heat dissipating tubes are made of copper and it is well known in the art that copper has good elasticity. Therefore, after a long period of time applying the heat dissipating fins on top of the heat dissipating tubes, the heat dissipating tubes gradually deform and eventually the entire heat sink is damaged and the operator needs to replace the damaged heat sink with a new one, which is quite troublesome and economic inefficient.

To overcome the shortcomings, the present invention tends to provide an improved supporting seat to mitigate the aforementioned problems.

SUMMARY OF THE INVENTION

The primary objective of the present invention is to provide an improved supporting seat to support weight of the heat dissipating fins such that the weight of the heat dissipating fins will not fall directly on top of the heat dissipating tubes and the heat dissipating tube will maintain intact after a long period of time.

In order to accomplish the aforementioned objective, the supporting seat of the present invention includes a base with two flanges respectively extending from two opposed sides of the base to be securely connected to a heat dissipating plate of a heat sink, two arms extending upward between the two flanges, two engagement plates respectively formed on a free end of a corresponding arm and multiple through holes defined through each of the engagement plate for extension of the heat dissipating tubes. Because the engagement plate are securely connected to bottom faces of the heat dissipating fins and the base is securely connected to the base of the supporting seat, the heat dissipating tubes are protected from deformation.

Other objects, advantages and novel features of the invention will become more apparent from the following detailed description when taken in conjunction with the accompanying drawings.

DETAILED DESCRIPTION OF THE PREFERRED EMBODIMENT

Figure 1:
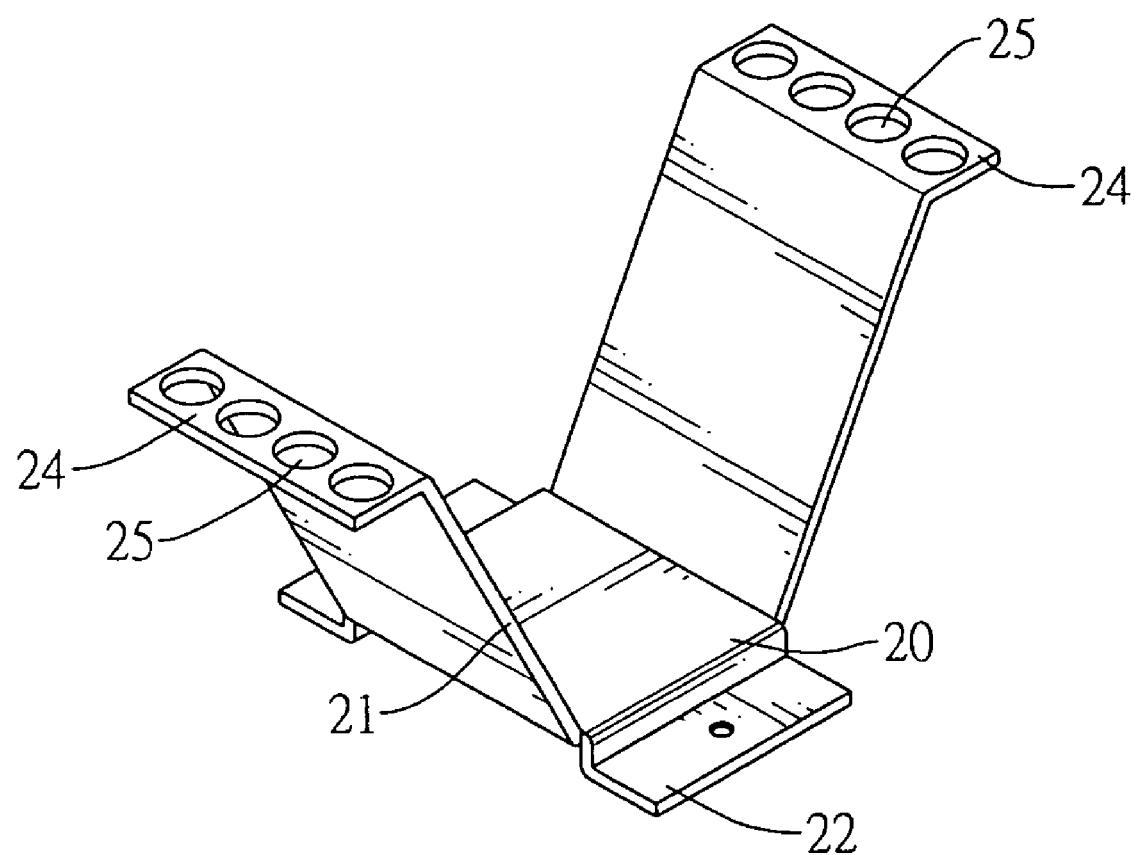
FIG. 1 is a perspective view of the supporting seat of the present invention.

With reference to FIG. 1, it is noted that the supporting seat in accordance with the present invention includes a base (20), two arms (21) respectively extending from two opposed sides of the base (20) and being oblique relative to the base (20), two flanges (22) respectively extending from two opposed sides of the base (20) between the two arms (21), two engagement plates (24) respectively formed on a free end of a corresponding arm (21) and multiple through holes (25) defined through each of the engagement plates (24).

Figure 2:
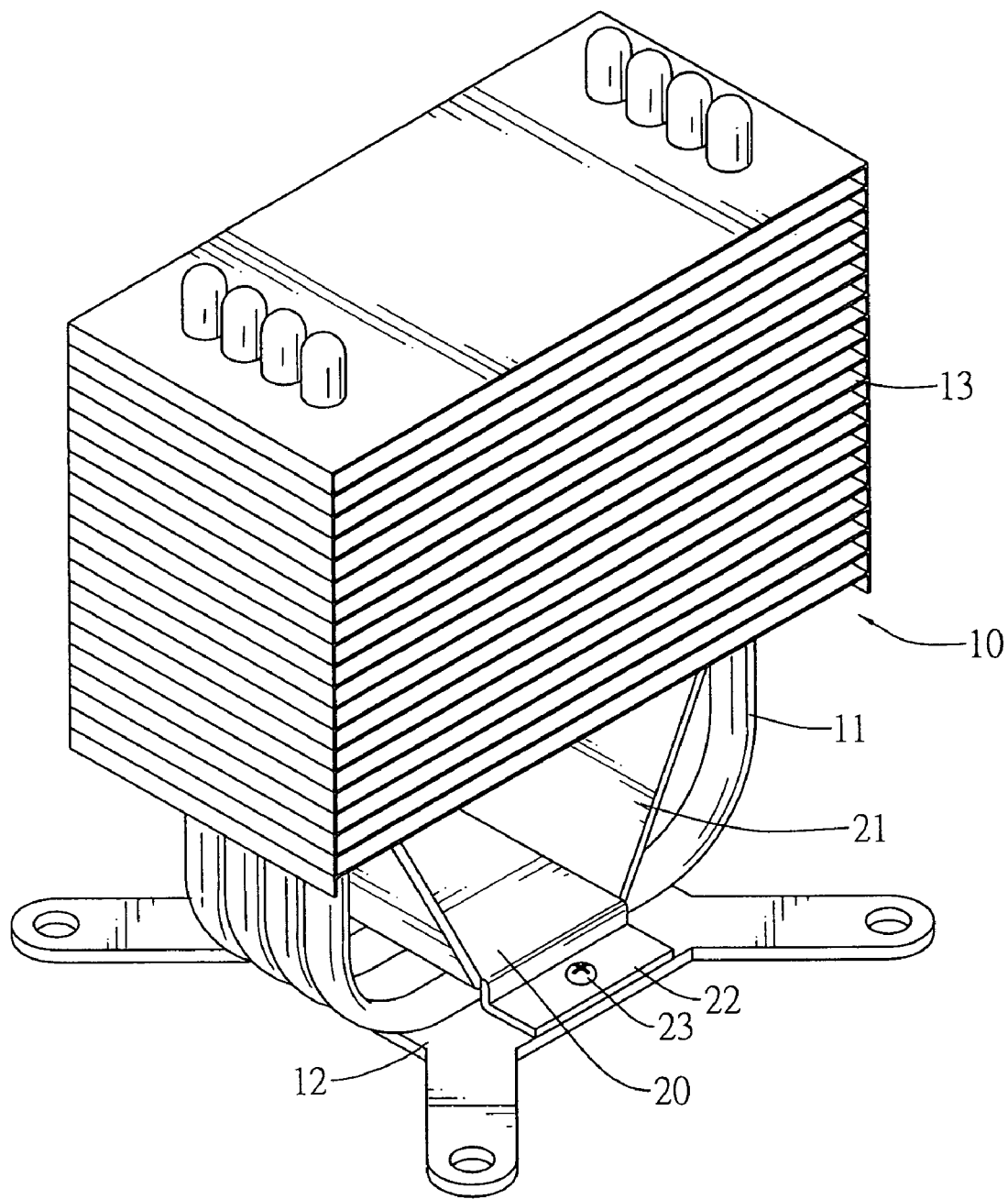
FIG. 2 is a perspective view showing the application of the supporting seat with a heat sink.
Figure 3:
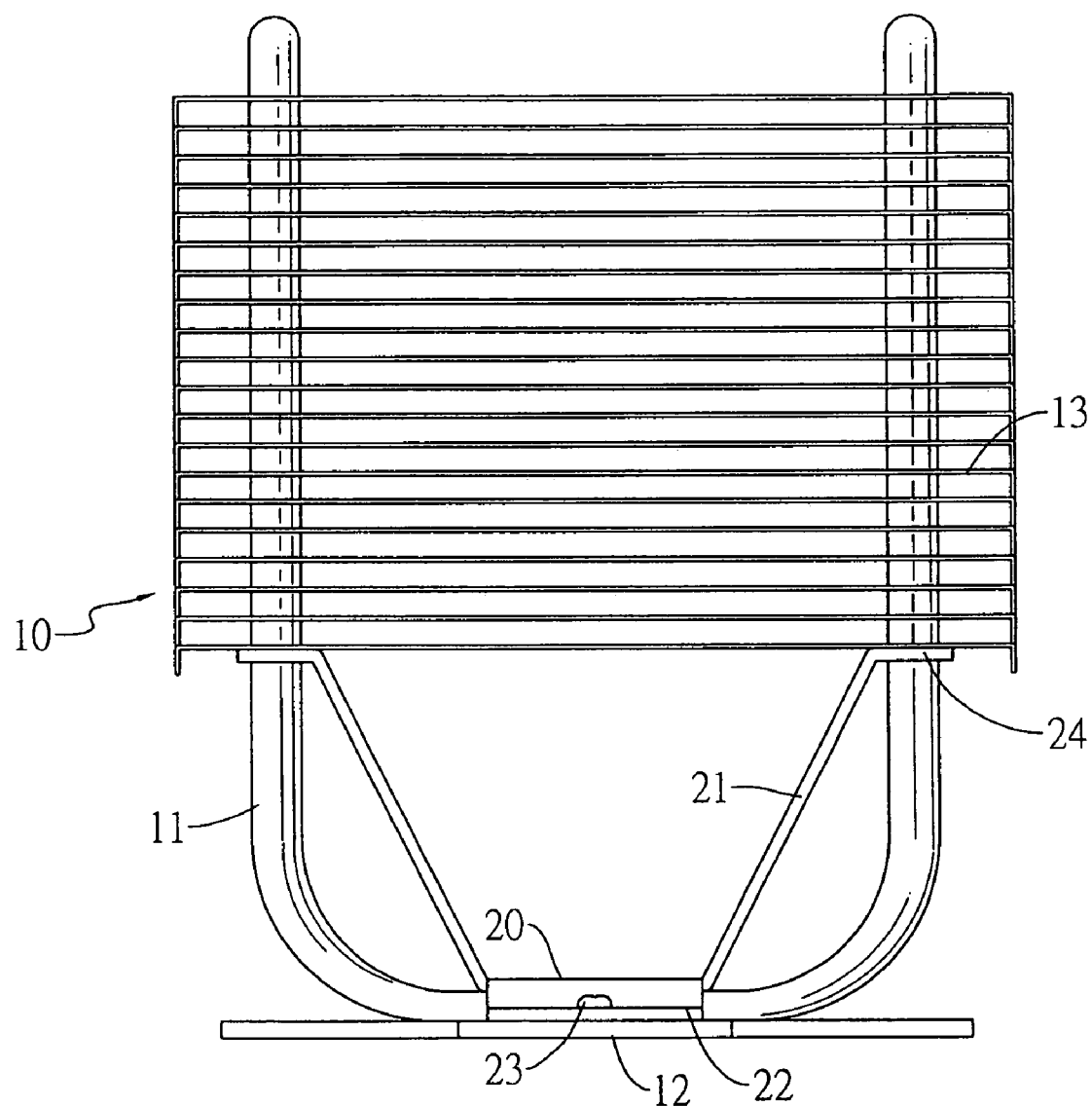
FIG. 3 is a side plan view showing the application of the supporting seat.

With reference to FIGS. 2 and 3, when the supporting seat of the present invention is employed in a heat sink (10) having a heat conducting plate (12) to be connected to a heat generating source, i.e. CPU, multiple U-shaped heat dissipating tubes (11) securely connected to the heat conducting plate (12) and multiple heat dissipating fins (13) each securely connected to the heat dissipating tubes (11), the base (20) is first connected to the heat conducting plate (12) with securing elements (23), e.g. screws, rivets or the like, extending through a side face of each of the flanges (22) to secure engagement between the base (20) and the heat conducting plate (12). Thereafter, the heat dissipating tubs (11) are extended through the through holes (25) in each of he engagement plates (24). Then the heat dissipating fins (13) are mounted on top of the engagement plates (24) to allow the engagement plates (24) to engage with bottom faces of the heat dissipating fins (13). Due to the support from the arms (21), the weight of the heat dissipating fins (13) will not deform the heat dissipating tubes (11). Thus the life span of the heat sink is prolonged.

Figure 4:
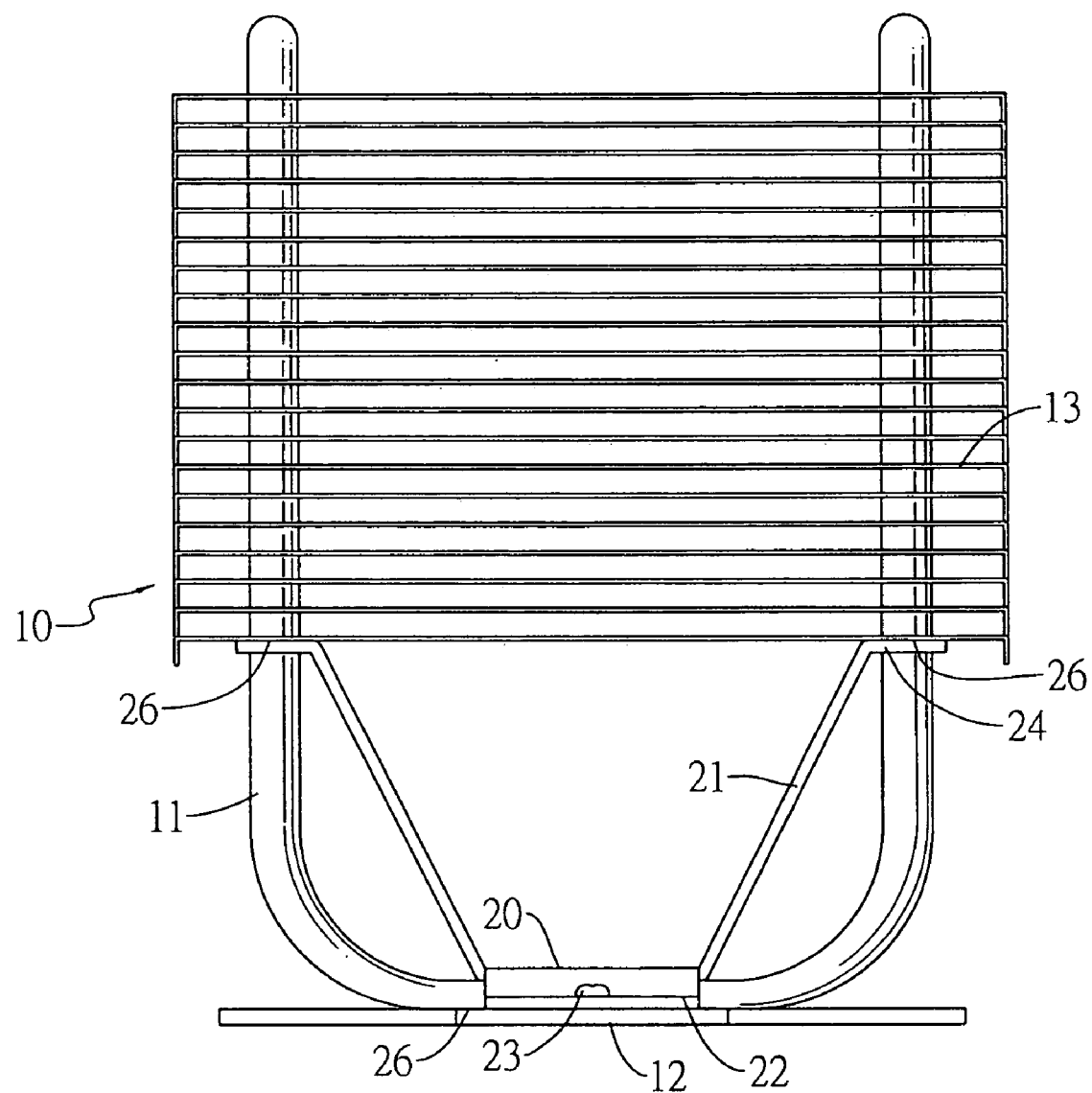
FIG. 4 is a side plan view showing that heat conductive glue or solder is applied to the engagement between the base and the heat conductive plate and/or between. the engagement plates and the bottom face of the heat dissipating fins.

With reference to FIG. 4, it is noted that although the securing element (23) is applied to secure engagement between the base (20) of the supporting seat of the present invention and the heat conductive plate (12) of the heat sink, heat conductive glue or solder (26) is applied may also be considered as an alternative. The heat conductive glue or solder (26) may also be applied to secure engagement between the engagement plates (24) and the bottom face of the heat dissipating fins (13).

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A supporting seat for a heat sink having a heat conductive plate, multiple heat dissipating tubes extending outward from the heat conductive plate and multiple heat dissipating fins mounted on top of the heat conductive plate and having the heat dissipating tubes extended therethrough, the supporting seat comprising:

a base adapted to be securely connected to the heat conductive plate;

two arms extending from two opposed sides of the base and being oblique relative to the base;

two engagement plates each formed on a free end of a corresponding arm and adapted to engage with a bottom face of a lowermost one of the heat dissipating fins; and multiple through holes defined through each of the two engagement plates for extension of the heat dissipating tubes, whereby weight of the heat dissipating fins is supported and deformation of the heat dissipating tubes is prevented.

2. The supporting seat as claimed in claim 1, wherein the base further has two flanges respectively formed on two opposed side faces of the base to be sandwiched between the two arms and adapted to be securely connected to the heat conductive plate.

3. The supporting seat as claimed in claim 1, wherein a material selected from the group consisting of solder and heat conductive glue is applied to engagement between the base and the heat conductive plate to secure the engagement therebetween.

4. The supporting seat as claimed in claim 3, wherein a material selected from the group consisting of solder and heat conductive glue is applied to engagement between the engagement plates and the lowermost heat dissipating fin to secure the engagement therebetween.

5. The supporting seat as claimed in claim 1, wherein securing element is applied to secure engagement between the flanges and the heat conductive plate.

* * * * *